(12) United States Patent
Tsai

(10) Patent No.: US 12,178,018 B2
(45) Date of Patent: Dec. 24, 2024

(54) BACK COVER HEAT DISSIPATION STRUCTURE OF LAPTOP

(71) Applicant: GETAC TECHNOLOGY CORPORATION, New Taipei (TW)

(72) Inventor: Yin-Cheng Tsai, Taipei (TW)

(73) Assignee: Getac Technology Corporation, New Taipei (TW)

( * ) Notice: Subject to any disclaimer, the term of this patent is extended or adjusted under 35 U.S.C. 154(b) by 155 days.

(21) Appl. No.: 18/097,158

(22) Filed: Jan. 13, 2023

(65) Prior Publication Data

US 2023/0400898 A1    Dec. 14, 2023

Related U.S. Application Data

(60) Provisional application No. 63/351,425, filed on Jun. 12, 2022.

(51) Int. Cl.
*H05K 7/20* (2006.01)
*G06F 1/20* (2006.01)
(Continued)

(52) U.S. Cl.
CPC ......... *H05K 7/20481* (2013.01); *G06F 1/203* (2013.01); *G06K 19/0723* (2013.01); *H01Q 1/02* (2013.01); *H04B 1/0057* (2013.01); *H04B 1/16* (2013.01); *H04B 5/72* (2024.01); *H04B 5/73* (2024.01); *H05K 1/0203* (2013.01)

(58) Field of Classification Search
CPC ................ G06F 1/203; G06K 19/0723; H05K 7/20472–20481; H05K 7/2039; H05K 7/20436; H05K 1/0209; H05K 1/0203; H01Q 1/02; H04B 1/0057; H04B 1/16; H04B 5/72; H04B 5/73
See application file for complete search history.

(56) References Cited

U.S. PATENT DOCUMENTS

2006/0109184 A1*   5/2006   Chen ............... G06F 1/1698
                                                                343/702
2017/0244153 A1*   8/2017   Chen ............... H01Q 13/10
(Continued)

FOREIGN PATENT DOCUMENTS

CN      103326103 A     9/2013
CN      106575819 A     4/2017
(Continued)

*Primary Examiner* — Jacob R Crum
(74) *Attorney, Agent, or Firm* — Cooper Legal Group, LLC

(57) ABSTRACT

A back cover heat dissipation structure of a laptop includes a radio frequency tag module, a back cover, and a metal foil. The radio frequency tag module includes a circuit board with a component region and an antenna region. The component region and the antenna region are disposed on a bottom side and a top side of the circuit board, respectively. The back cover includes a plating region and a receiving chamber. The receiving chamber receives the radio frequency tag module. The top side of the circuit board is attached to the bottom of the receiving chamber. The metal foil not only covers the bottom side of the circuit board but also extends to cover the plating region. Therefore, not only is heat dissipation achieved, the impedance of components on the circuit board can also be adjusted to optimize the sensing capability of the radio frequency tag module.

8 Claims, 4 Drawing Sheets

(51) Int. Cl.
　　　*G06K 19/07*　　　(2006.01)
　　　*H01Q 1/02*　　　(2006.01)
　　　*H04B 1/00*　　　(2006.01)
　　　*H04B 1/16*　　　(2006.01)
　　　*H04B 5/72*　　　(2024.01)
　　　*H04B 5/73*　　　(2024.01)
　　　*H05K 1/02*　　　(2006.01)

(56) References Cited

U.S. PATENT DOCUMENTS

2018/0211150 A1\*　7/2018　Orihara ................ H01Q 1/2216
2021/0091450 A1　　3/2021　Park et al.
2022/0394874 A1\*　12/2022　Masuda .................. H01Q 1/02

FOREIGN PATENT DOCUMENTS

CN　　　206574838 U　　10/2017
KR　　　20160067321 A　　6/2016
TW　　　201909344 A　　3/2019

\* cited by examiner

Bottom side

Top side

BACK COVER HEAT DISSIPATION STRUCTURE OF LAPTOP

The application claims priority to U.S. Provisional Application No. 63/351,425, filed on Jun. 12, 2022, the disclosure of which is hereby incorporated by reference herein in its entirety.

BACKGROUND OF THE INVENTION

Field of the Invention

The present disclosure relates to heat dissipation structures and, more particularly, to a back cover heat dissipation structure of a laptop.

Description of the Prior Art

Since laptops are made to be portable, their dimension and thickness requirements are strict. To this end, all the components and parts of a laptop are confined to a small, narrow internal space. As a result, the heat dissipation requirements for all the components and parts of a laptop are stricter than that of a desktop computer. Therefore, it is imperative to increase the heat dissipation area of all the components and parts of the laptop.

SUMMARY OF THE INVENTION

The disclosure provides a back cover heat dissipation structure conducive to increasing the heat dissipation area of all the computer elements, parts and components of a laptop.

A back cover heat dissipation structure of a laptop, as provided by the disclosure, comprises a radio frequency tag module, a back cover, and a metal foil. The radio frequency tag module comprises a circuit board with a component region and an antenna region, wherein the component region and the antenna region are disposed on a bottom side and a top side of the circuit board, respectively. The back cover comprises a plating region and a receiving chamber. The receiving chamber receives the radio frequency tag module. The top side of the circuit board is attached to the bottom of the receiving chamber. The metal foil covers the bottom side of the circuit board and extends to cover the plating region.

In an embodiment of the disclosure, the metal foil is aluminum foil.

In an embodiment of the disclosure, the radio frequency tag module not covered with the metal foil operates within an offset operating frequency range.

In an embodiment of the disclosure, the offset operating frequency range is 11 Mhz to 12 MHz.

In an embodiment of the disclosure, the radio frequency tag module covered with the metal foil operates within an operating frequency range.

In an embodiment of the disclosure, the operating frequency range is 13 Mhz to 14 MHz.

In an embodiment of the disclosure, at least one component with mismatched impedance is disposed in the component region.

In an embodiment of the disclosure, the component with mismatched impedance comprises at least one resistor-inductor-capacitor (RLC) component.

Therefore, the disclosure is advantageously characterized by a metal foil which covers the radio frequency tag module and extends to cover a plating region of a back cover, so as to increase the heat dissipation area of all the components and parts of the laptop. Furthermore, the impedance of components of the radio frequency tag module is adjusted to optimize the sensing capability of the radio frequency tag module and thereby prevent sensing failure.

The aforesaid and other objectives, features, and advantages of the disclosure are herein illustrated with specific embodiments, depicted with accompanying drawings, and described in detail below.

DETAILED DESCRIPTION OF THE EMBODIMENTS

Figure 1:
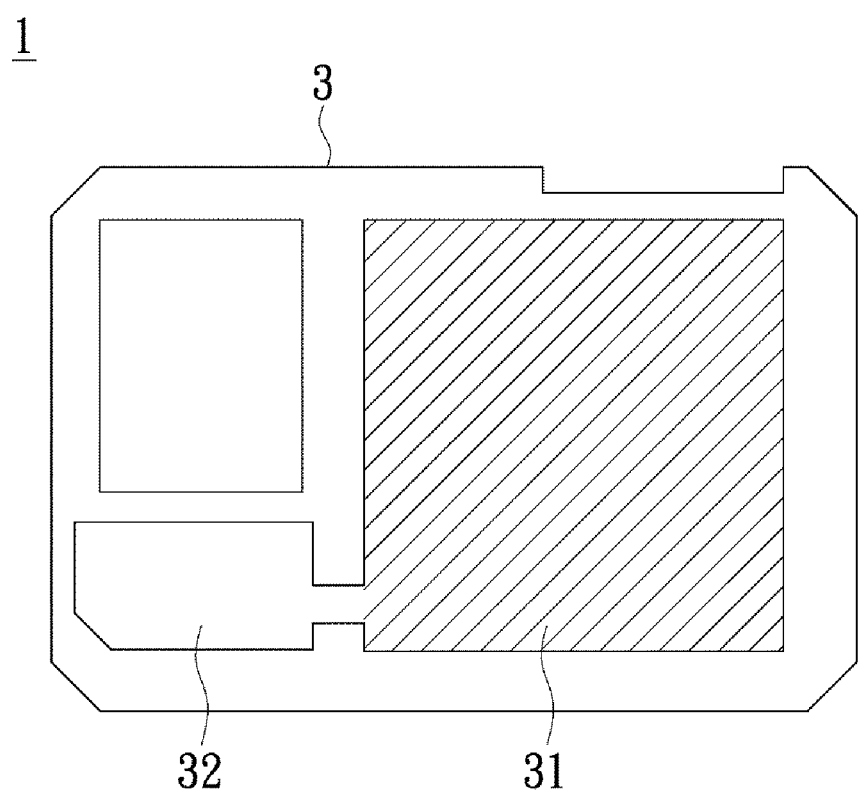
FIG. 1 is a schematic view of a back cover of a laptop according to an embodiment of the disclosure.

Referring to FIG. 1, there is shown a schematic view of a back cover of a laptop according to an embodiment of the disclosure. A back cover 3 of a back cover heat dissipation structure 1 of a laptop, as provided by the disclosure, comprises a plating region 31 and a receiving chamber 32. The plating region 31 is a metal film or any other coating with high coefficient of thermal conductivity and is adapted to increase heat dissipation area and achieve heat dissipation.

Figure 2:
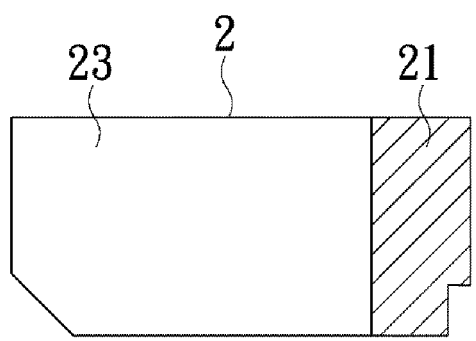
FIG. 2 is a schematic view of a radio frequency tag module according to an embodiment of the disclosure.
Figure 2:
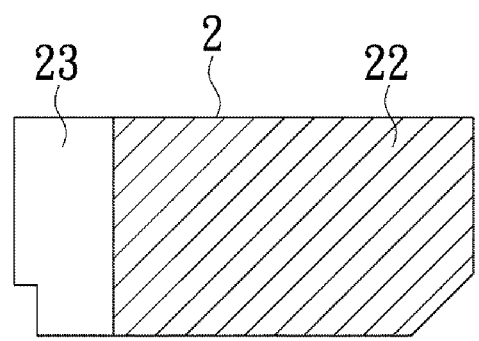

Referring to FIG. 2, there is shown a schematic view of a radio frequency tag module according to an embodiment of the disclosure. A radio frequency tag module 2 of the back cover heat dissipation structure 1 of a laptop, as provided by the disclosure, comprises a circuit board 23 with a component region 21 and an antenna region 22. The component region 21 and the antenna region 22 are disposed on the bottom side and the top side of the circuit board 23, respectively.

Figure 3:
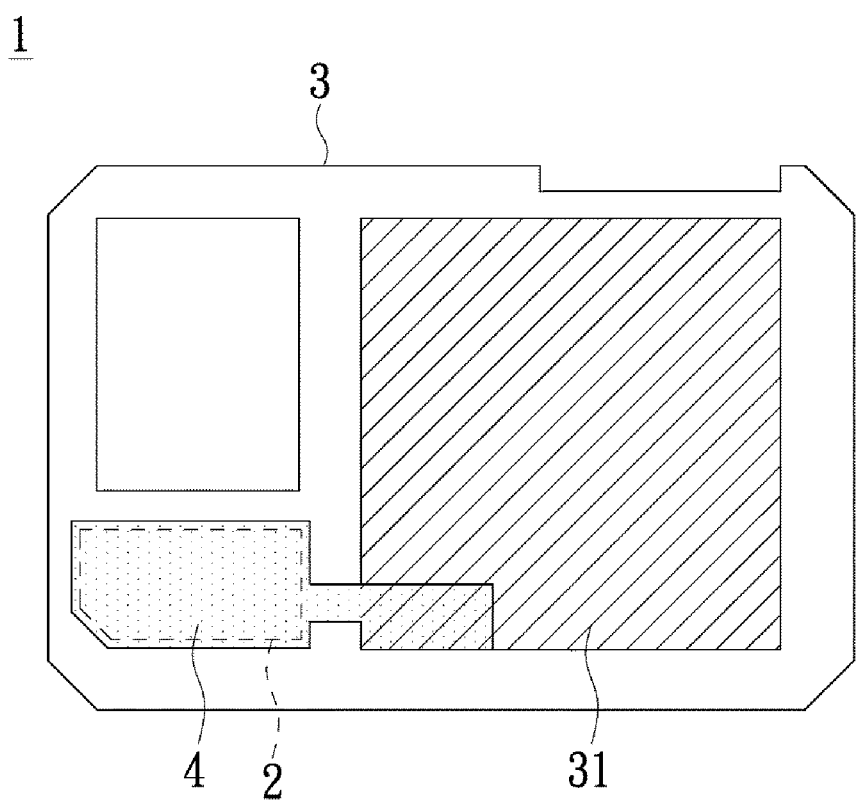
FIG. 3 is a schematic view of a back cover heat dissipation structure of a laptop according to an embodiment of the disclosure.

Referring to FIG. 3, there is shown a schematic view of the back cover heat dissipation structure of a laptop according to an embodiment of the disclosure. The back cover heat dissipation structure 1 of a laptop, as provided by the disclosure, comprises the radio frequency tag module 2, the back cover 3, and a metal foil 4. The receiving chamber 32 of the back cover 3 receives the radio frequency tag module 2. The top side of the circuit board 23 of the radio frequency tag module 2 is attached to the bottom of the receiving chamber 32. The metal foil 4, exemplified by aluminum foil, not only covers the bottom side of the circuit board 23 of the radio frequency tag module 2, but also extends to cover the plating region 31 of the back cover 3, so as to increase heat dissipation area and achieve heat dissipation.

Figure 4:
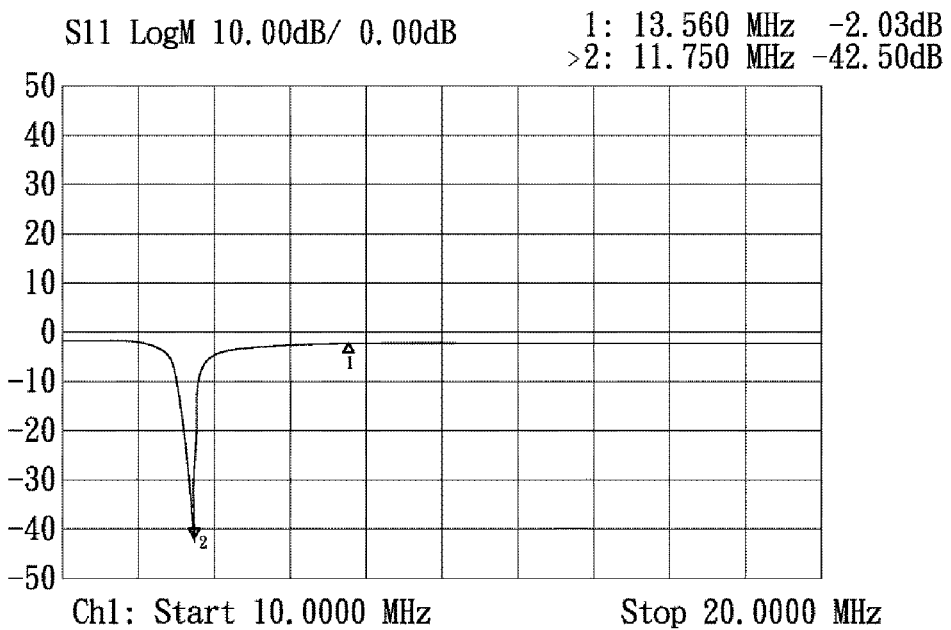
FIG. 4 is a schematic view of the operating frequency of the radio frequency tag module before being covered with a metal foil according to an embodiment of the disclosure.
Figure 5:
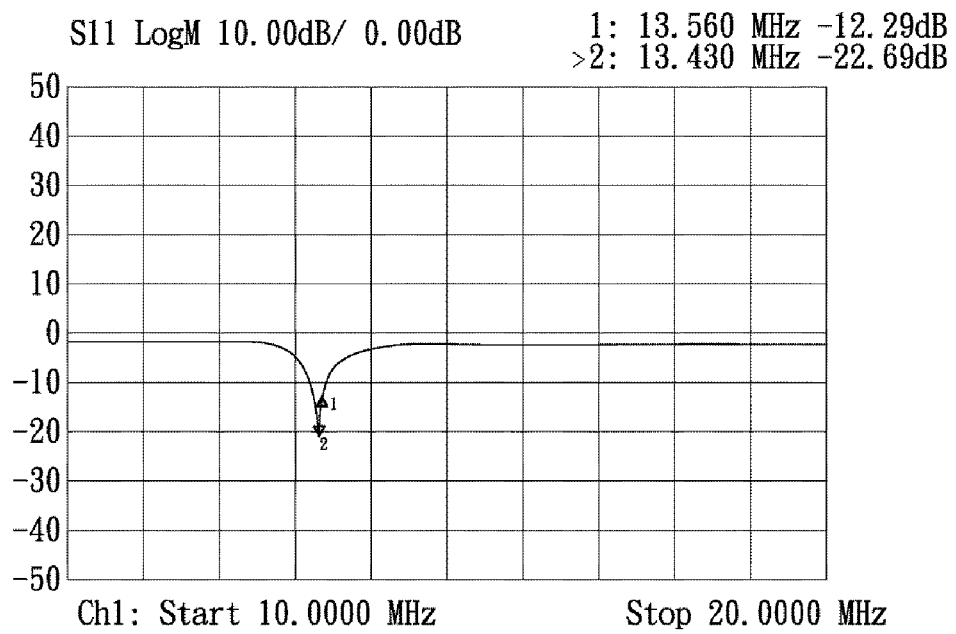
FIG. 5 is a schematic view of the operating frequency of the radio frequency tag module after being covered with the metal foil according to an embodiment of the disclosure.

When the metal foil 4 covers the radio frequency tag module 2, the metal foil 4 causes impedance offset or mismatch to components in the component region 21 on the circuit board 23. Thus, before the radio frequency tag module 2 is covered with the metal foil 4, at least one component with offset or mismatched impedance is selected and placed in the component region 21 (for example, at least one resistor-inductor-capacitor (RLC) component with offset or mismatched impedance is selected.) When the metal foil 4 covers the radio frequency tag module 2, the offset or mismatched impedance of the component is adjusted, such that the operating frequency of the radio frequency tag module 2 falls within an appropriate operating frequency range, such as 13 Mhz to 14 MHz, or close to an operating frequency of 13.56 MHz, for example. By contrast, the radio frequency tag module 2 is not covered with the metal foil 4 not only operates within an offset operating frequency range, such as 11 Mhz to 12 MHz, or approximately at an offset operating frequency of 11.75 MHz, but is also characterized by narrow bandwidth and poor sensing capability, as shown in FIG. 4. The radio frequency tag module 2 covered with the metal foil 4 not only can operate at an operating frequency of 13.43 MHz but is also characterized by wide bandwidth and good sensing capability, as shown in FIG. 5. Therefore, the back cover heat dissipation structure 1 of a laptop, as provided by the disclosure, exhibits optimal sensing capability of the radio frequency tag module 2 and prevents sensing failure.

Therefore, the back cover heat dissipation structure 1 of a laptop, as provided by the disclosure, comprises a metal foil which covers the radio frequency tag module and extends to cover a plating region of a back cover, so as to increase the heat dissipation area of all the computer elements, parts and components of the laptop. Furthermore, the impedance of components of the radio frequency tag module is adjusted to optimize the sensing capability of the radio frequency tag module and thereby prevent sensing failure.

Although the disclosure is disclosed above by embodiments, the embodiments are not restrictive of the disclosure. Changes and modifications made by persons skilled in the art to the embodiments without departing from the spirit and scope of the disclosure must be deemed falling within the scope of the claims of the disclosure. Accordingly, the legal protection for the disclosure should be defined by the appended claims.

What is claimed is:

1. A back cover heat dissipation structure of a laptop, comprising:
   a radio frequency tag module comprising a circuit board with a component region and an antenna region, wherein the component region and the antenna region are disposed on a bottom side and a top side of the circuit board, respectively;
   a back cover comprising a plating region and a receiving chamber, wherein the receiving chamber receives the radio frequency tag module, and the top side of the circuit board is attached to a bottom of the receiving chamber; and
   a metal foil covering the bottom side of the circuit board and extending to cover the plating region.

2. The back cover heat dissipation structure of a laptop according to claim 1, wherein the metal foil is aluminum foil.

3. The back cover heat dissipation structure of a laptop according to claim 1, wherein the radio frequency tag module not covered with the metal foil operates within an offset operating frequency range.

4. The back cover heat dissipation structure of a laptop according to claim 3, wherein the offset operating frequency range is 11 MHz to 12 MHz.

5. The back cover heat dissipation structure of a laptop according to claim 1, wherein the radio frequency tag module covered with the metal foil operates within an operating frequency range.

6. The back cover heat dissipation structure of a laptop according to claim 5, wherein the operating frequency range is 13 MHz to 14 MHz.

7. The back cover heat dissipation structure of a laptop according to claim 1, wherein at least one component with mismatched impedance is disposed in the component region.

8. The back cover heat dissipation structure of a laptop according to claim 7, wherein the at least one component with mismatched impedance comprises at least one resistor-inductor-capacitor (RLC) component.

\* \* \* \* \*